(12) United States Patent
Kunda et al.

(10) Patent No.: US 7,320,940 B2
(45) Date of Patent: Jan. 22, 2008

(54) METHOD FOR MANUFACTURING ELECTRONIC DEVICE INCLUDING PACKAGE

(75) Inventors: Tomohito Kunda, Okazaki (JP); Tsukasa Fukurai, Kisarazu (JP)

(73) Assignees: DENSO CORPORATION, Kariya (JP); Yoshikawa Kogyo Co., Ltd., Fukuoka-pref. (JP)

( * ) Notice: Subject to any disclaimer, the term of this patent is extended or adjusted under 35 U.S.C. 154(b) by 501 days.

(21) Appl. No.: 10/941,929

(22) Filed: Sep. 16, 2004

(65) Prior Publication Data

US 2005/0062067 A1  Mar. 24, 2005

(30) Foreign Application Priority Data

Sep. 24, 2003  (JP)  ............. 2003-331718

(51) Int. Cl.
  *H01L 21/302*  (2006.01)
  *H01L 21/461*  (2006.01)
  *H01L 21/00*  (2006.01)

(52) U.S. Cl. ............. 438/692; 438/125; 257/E21.5; 257/E21.51; 257/E21.511

(58) Field of Classification Search ............. 438/692, 438/125
See application file for complete search history.

(56) References Cited

U.S. PATENT DOCUMENTS

| | | | |
|---|---|---|---|
| 4,243,729 A | | 1/1981 | Hascoe |
| 4,459,216 A | * | 7/1984 | Nakazato et al. ........ 252/79.4 |
| 4,820,659 A | * | 4/1989 | Dholakia et al. ........ 438/26 |
| 4,861,374 A | * | 8/1989 | Eriksson ............... 510/256 |
| 5,338,967 A | * | 8/1994 | Kosaki ................ 257/620 |
| 5,770,468 A | * | 6/1998 | Kosaki ............... 228/123.1 |
| 6,106,728 A | * | 8/2000 | Iida et al. ............ 210/743 |
| 6,110,011 A | | 8/2000 | Somekh et al. |
| 6,162,366 A | * | 12/2000 | Ishikura et al. ......... 216/13 |
| 6,274,063 B1 | * | 8/2001 | Li et al. .............. 252/79.1 |
| 6,355,505 B1 | * | 3/2002 | Maeda et al. .......... 438/122 |
| 6,800,218 B2 | * | 10/2004 | Ma et al. ............. 252/79.1 |
| 6,974,517 B2 | * | 12/2005 | Hanna ................ 156/109 |
| 7,052,625 B2 | * | 5/2006 | Chamberlin et al. ..... 216/88 |
| 2001/0055836 A1 | | 12/2001 | Kunda |
| 2003/0006488 A1 | * | 1/2003 | Wakabayashi et al. ..... 257/666 |
| 2004/0232379 A1 | * | 11/2004 | Ameen et al. ......... 252/186.1 |
| 2005/0176250 A1 | * | 8/2005 | Takahashi et al. ...... 438/691 |
| 2006/0091557 A1 | * | 5/2006 | Sakamoto et al. ...... 257/774 |

FOREIGN PATENT DOCUMENTS

| | | |
|---|---|---|
| EP | 0 951 069 A1 | 10/1999 |
| EP | 0 989 605 A1 | 3/2000 |
| JP | 8107487 * | 6/1983 |
| JP | 60221585 * | 11/1985 |
| JP | A-8-162583 | 6/1996 |
| JP | 2000-509985 * | 7/2000 |
| JP | A-2000-297387 | 10/2000 |
| JP | A-2001-239386 | 9/2001 |

* cited by examiner

*Primary Examiner*—David A. Zarneke
(74) *Attorney, Agent, or Firm*—Posz Law Group, PLC

(57) ABSTRACT

In a method for manufacturing an acceleration sensor device, a lid for covering an opening of a package body is prepared by stamping. The lid is plated and plating films are formed on surfaces of the lid. The burrs formed on the surfaces of the lid in the plating process are removed by chemical polishing. A semiconductor sensor chip is inserted in the package body through the opening and fixed. Then, the lid 70 is attached to the package body.

8 Claims, 4 Drawing Sheets

METHOD FOR MANUFACTURING ELECTRONIC DEVICE INCLUDING PACKAGE

CROSS REFERENCE TO RELATED APPLICATION

This application is based on and incorporates herein by reference Japanese Patent Application No. 2003-331718 filed on Sep. 24, 2003.

FIELD OF THE INVENTION

The present invention relates to a method for manufacturing an electronic device including a package.

BACKGROUND OF THE INVENTION

A package having an opening covered with a lid is used for housing an electronic component, such as an acceleration sensor chip, an angle speed sensor chip, and a surface acoustic component. The electronic component is constructed of elements formed on chip surfaces with a few μm orders of fine structures that are processed by micromachining technique. The electronic component is inserted into a body of the package through the opening, provided on one of the sides of the package body.

A package of such a kind is proposed in US2001/55836 (JP-A-2002-005951). A semiconductor dynamic sensor chip having a comb-teeth-like structure is included in the package. The sensor chip is mounted on a ceramic package case and a metal lid is seam-welded to the package case. To make the seam-welding of the lid easier, surfaces of the lid may be plated.

When the lid is plated, plating films are formed on its surfaces. Burrs (dross) of a few μm to tens of μm develop on or adhere to the plating films. A plating film is formed on a surface of the lid and hangnail-like burrs are formed on the surface of the plating film. The burrs may develop around waste metals that exist in the plating tank and adhere to the surface of the lid during the plating process.

A sensor chip housed in such a package body, for instance one in US2001/55836, has a few μm orders of movable structures on its surfaces. If burrs formed on the lid surface fall on the movable structure during a transfer of the chip, the characteristics of the sensor chips may be affected by the burrs. The same problems could occur in other electronic devices if they are provided with plated lids and electronic components having similar movable structures are housed in the packages. The electronic components having such movable structures include an angle speed sensors and a surface acoustic component. This burr problem could be a common problem among packages having a plated lid.

SUMMARY OF THE INVENTION

The present invention therefore has an objective to provide a method for manufacturing an electronic device including a package having a plated lid such that burrs on a surface of the lid are less likely to fall onto the electronic component. A method of the present invention includes plating a lid of a package, removing burrs on a surface of the lid by chemical polishing, inserting an electronic component into a package body, and attaching the lid to the package body.

When the lid is plated, plating films are formed on surfaces of the lid, and burrs develop on or adhere to the plating films. By treating the surface of the lid, that is, the plating films, by chemical polishing, the burrs are greatly reduced in comparison with other method, for instance, sintering and electrolytic polishing. Namely, problems resulting from burrs on the surface of the lid falling onto the electronic component during transfer of the electronic device are reduced by this method.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENT

The preferred embodiments of the present invention will be explained with reference to the accompanying drawings.

Figure 1:
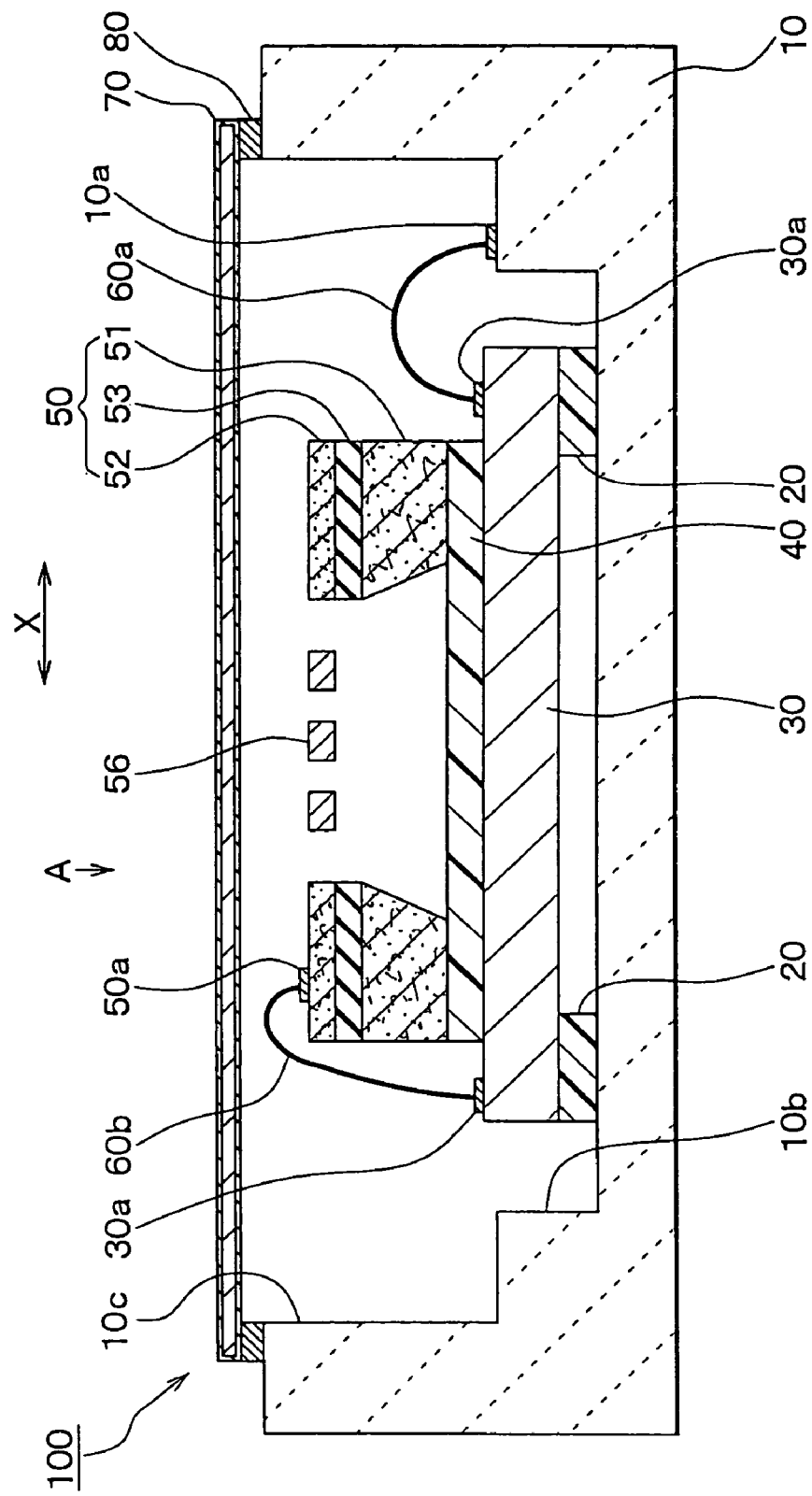
FIG. 1 is a brief cross-sectional view of an acceleration sensor device according to an embodiment of the present invention.

Referring to FIG. 1, an acceleration sensor device 100, which is an electronic device, includes a package body 10, a control IC chip 30, a semiconductor sensor chip 50, and a lid 70. The package body 10 made of ceramic has a recess 10b and an opening 10c. The recess 10b is formed by hollowing a part of one of inner faces of the package body 10 for holding components. The opening 10c is formed on one of sides of the package body 10.

The control IC chip 30 is mounted on an inner bottom surface of the package body in the recess 10b, which is referred to as a die-attach surface, via an adhesive 20 made of silicone resin. The control IC chip 30 is configured as a signal processing circuit chip. The sensor chip 50, which is an electronic component, is mounted on the control IC chip 50 via a film adhesive 40. The sensor chip 50 can be mounted on the control IC chip 30 via a hardening-type adhesive.

Aluminum bonding pads 10a, 30a, 50a are formed on the package body 10, the control IC chip 30, and the sensor chip 50, respectively. The package body 10 and the control IC chip 30 are electrically connected with each other by connecting a wire 60a between the pads 10a and 30a. The control IC chip 30 and the sensor chip 50 are electrically connected with each other by connecting a wire 60b between the pads 30a and 50a. The wires 60a, 60b are produced by gold or aluminum wire-bonding.

The sensor chip 50 includes a silicon-on-insulator (SOI) substrate made by bonding the first silicon substrate 51 and the second silicon substrate 52 together via an oxide film 53. It is configured as a capacitance-type acceleration sensor chip for detecting an acceleration based on variations in capacitance between a movable electrode 54 and a fixed electrode 55. This acceleration sensor chip is a known device and therefore only briefly discussed.

Figure 2:
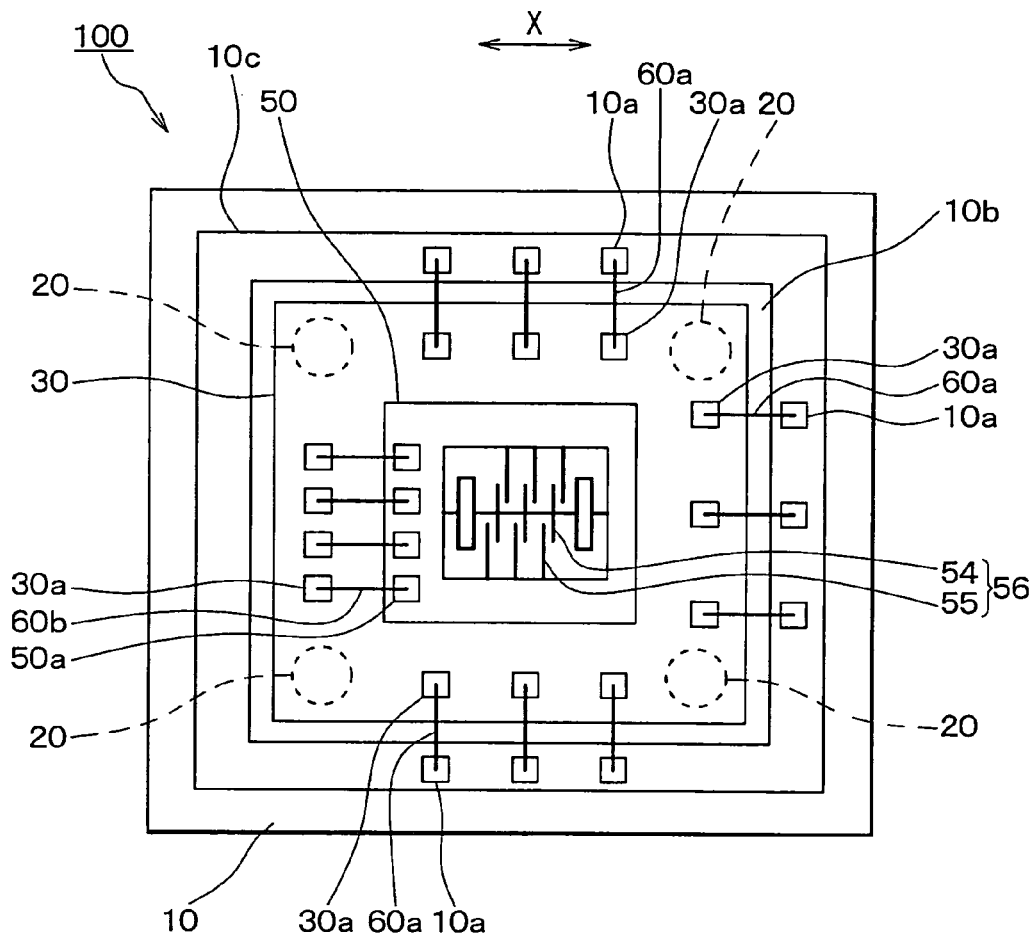
FIG. 2 is a brief plan view of the acceleration sensor without a lid viewed from an angle indicated with letter A showing an inside structure of the acceleration sensor according to the embodiment.

The second silicon substrate 52 has a beam structure 56 formed by arranging the comb teeth-like movable electrode 54 and the fixed electrode 55 so that they are opposed to each other. When acceleration is produced in the x-axis direction indicated with a two-headed arrow and a numeral x in FIG. 2, the movable electrode 54 moves in the x-axis direction. The capacitance between the movable electrode 54 and the fixed electrode 55 varies according to a variation of the movable electrode 54. A capacitance signal indicating the capacitance is transmitted to the control IC chip 30 via the wire 60b and converted into a voltage signal by the control IC chip 30. The converted signal is transmitted to the package body 10 via the wire 60a and to an external device via a wire (not shown) provided in the package body 10.

A main surface of the first silicon substrate 51 of the sensor chip 50 is bonded to a main surface of the first face of the control IC chip 30 via the film adhesive 40. The film adhesive 40 is made of a thermoset resin or a thermoplastic resin, including a polyimide base resin and acryl base resin. The adhesive 20 is applied to four corners of a main surface of the second face of the control IC chip 30, located opposite to the first face. Namely, the die-attach surface of the package body 10, that is a mounting surface on which the control IC chip 30 is mounted, is partially bonded to the main surface of the control IC chip 30. The adhesive 20 can be applied to the entire main surface of the second face.

A steel base metal lid 70 is fixed to the package body 10 to cover the opening 10c. Surfaces of the lid 70 are plated. More specifically, the lid 70 is made of Kovar and plated with nickel. The lid 70 can be made of 42 Alloy. The thickness of the plating film is about 1 μm to 5 μm. The lid 70 is fixed to a metal ring 80 brazed to the package body 10 by seam-welding. The control IC chip 30 and the sensor chip 50 housed in the package body 10 are covered with the lid 70 and protected. When the lid 70 is fixed to the package body 10, the inside of the package body 10 is hermetically sealed and maintained in a nitrogen atmosphere.

A method for manufacturing the lid 70 will be discussed referring to FIG. 3. A lid material is stamped and the lid 70 is formed in a specified shape (stamping step). A pretreatment is performed on the lid 70 (pretreatment step) prior to nickel plating. A pretreatment method regularly used in nickel plating may be used in this pretreatment step. For example, barrel polishing or chemical polishing is used.

The pretreated surfaces of the lid 70 are plated with nickel by electroplating (Ni-plating step). Plating films are formed on the surfaces of the lid 70 in this step. Then, the lid 70 is cleaned (cleaning step). The plated surfaces of the lid 70 are polished by chemical polishing (chemical polishing step). This step is not performed in other methods previously used for manufacturing the electronic device packages. The chemical polishing is a method for removing burrs on surfaces of a work by dipping the work in a polishing agent.

A polishing agent used for polishing a Kovar surface or a 42Alloy surface is used in the chemical polishing step. Kovar or 42Alloy is usually used in the pretreatment for plating.

Although this polishing agent is not for polishing a nickel surface, burrs that loosely adhere to the nickel plated surfaces can be removed by the action of components of an acid contained in the polishing agent. The chemical-polished lid 70 is further treated in cleaning and drying steps, and fixed to the package body 10.

Figure 4A:
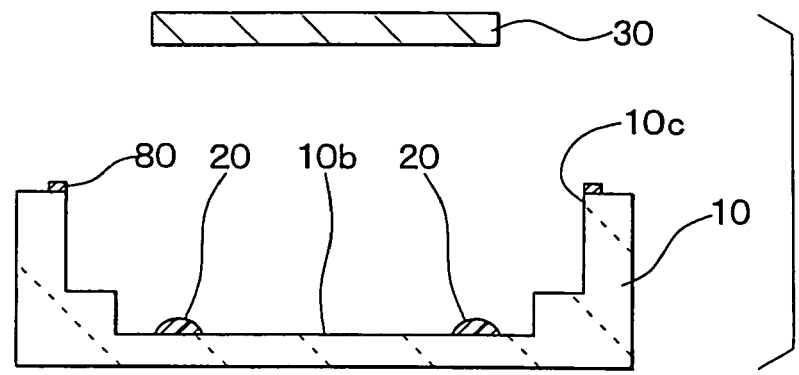
FIG. 4A is a brief cross-sectional view of the acceleration sensor in a step of an acceleration sensor manufacturing process according to the embodiment.
Figure 4B:
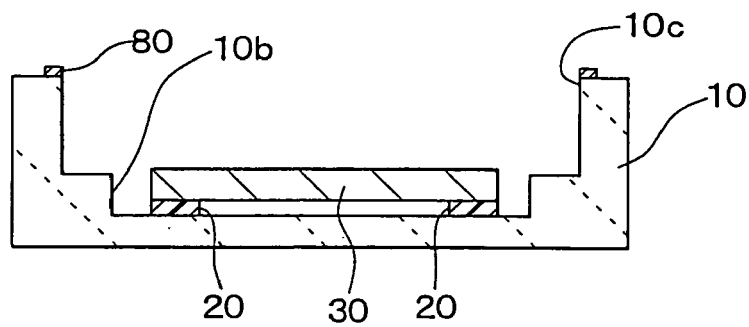
FIG. 4B is a brief cross-sectional view of the acceleration sensor in a step of the acceleration sensor manufacturing process according to the embodiment.

A method for manufacturing the acceleration sensor device 100 will be discussed referring to FIGS. 4A through 4D. The adhesive 20 is applied to appropriate portions of the die-attach surface via a dispenser from the opening 10c as shown in FIG. 4A. The control IC chip 30 is placed on the same surface on which the adhesive 20 is applied and then fixed to the package body 10 via the adhesive 20 (signal processing circuit chip mounting step) as shown in FIG. 4B. The metal ring 80 is brazed to the package body 10 in advance.

Figure 4C:
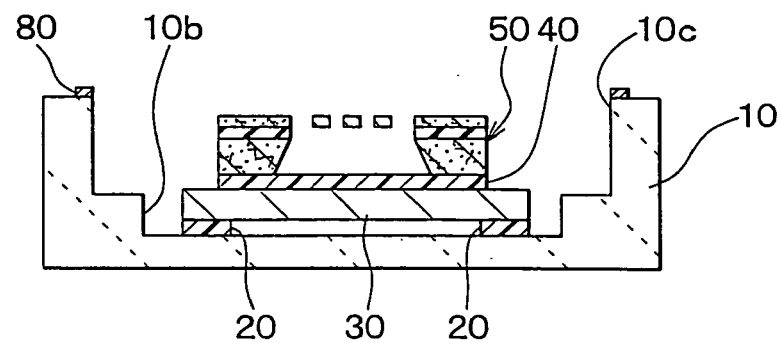
FIG. 4C is a brief cross-sectional view of the acceleration sensor in a step of the acceleration sensor manufacturing process.

The semiconductor sensor chip 50 with the film adhesive 40 is inserted into the package body 10 through the opening 10c and mounted on the control IC chip 30 (semiconductor sensor chip mounting step) as shown in FIG. 4C. This step is a part of a stacking process. Processes for preparing the semiconductor chip 50 with the film adhesive 40 and for mounting the sensor chip 50, that is the stacking process, are not discussed here in detail. The processes described in JP-A-2002-005951 can be applied to this stacking process.

Figure 4D:
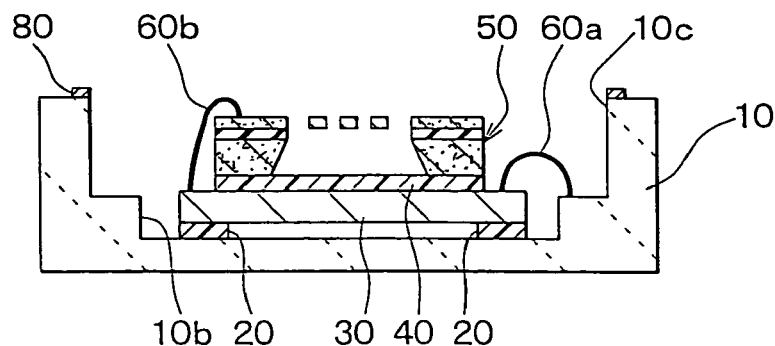
FIG. 4D is a brief cross-sectional view of the acceleration sensor in a step of the acceleration sensor manufacturing process according to the embodiment.

When the stacking process is completed, the sensor chip 50 is fixed to the control IC chip 30 via the film adhesive 40. A hardening-type adhesive can be used for fixing the sensor chip 50 to the control IC chip 30. Wires 60a, 60b are connected to the pads 10a, 30a, 50a by wire bonding with aluminum or gold (wire bonding step) as shown in FIG. 4D. Pads 10a, 30a, 50a shown in FIG. 1 are omitted in FIG. 4A through 4D.

Figure 3:
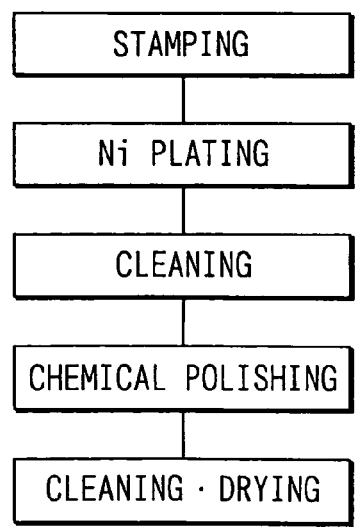
FIG. 3 is a flow chart showing a manufacturing process of the lid included in a package manufacturing method according to the embodiment.

The lid 70, prepared in the process shown in FIG. 3, is welded to the package body 10 by seam welding. Other types of welding may be used for welding the lid 70 to the package body 10. When the lid 70 is welded to the package body 10, the manufacturing process of the acceleration sensor device 100 is completed. The acceleration sensor device 100 is, for example, mounted in the ECU of a vehicle for detecting acceleration produced by an applied force as previously discussed.

Figure 6:
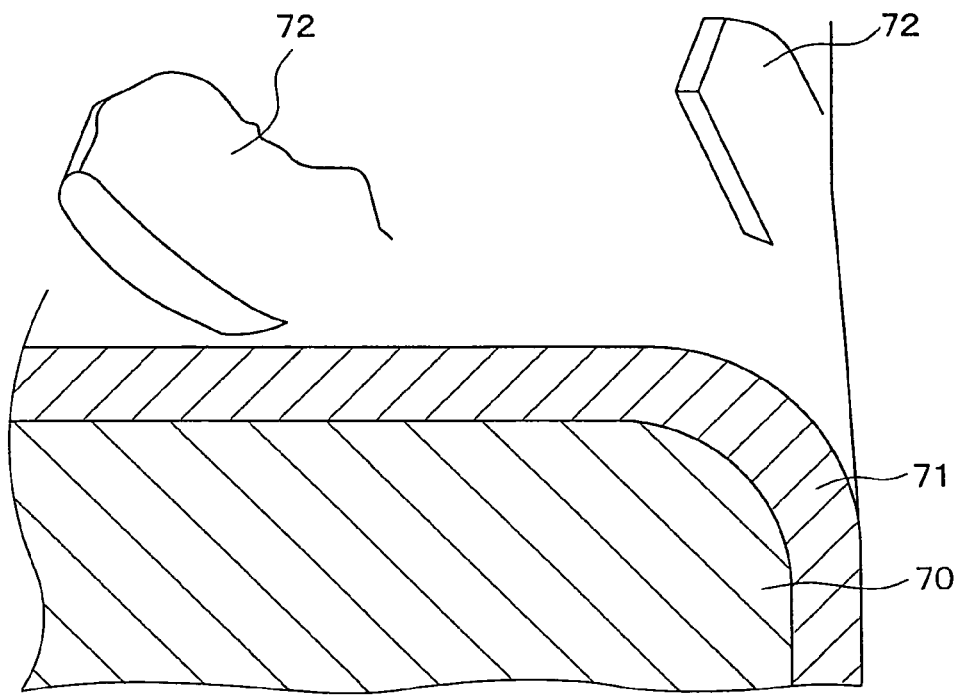
FIG. 6 is a partial perspective view of the lid, surfaces of which are plated, showing burrs on the surfaces.

In this method, plating films 71 are formed on the surfaces of the lid 70 and burrs 72 are formed on the plating films as shown in FIG. 6, which is a sketch of the lid 70 from a microscope observation. The burrs 72 on the plating films are removed by chemical polishing in prior to the attachment of the lid 70 to the package body 10. The lid 70 is attached to the package body 10 to cover the opening 10c after the sensor chip 50 is inserted into the package body 10 through the opening 10c.

Figure 5:
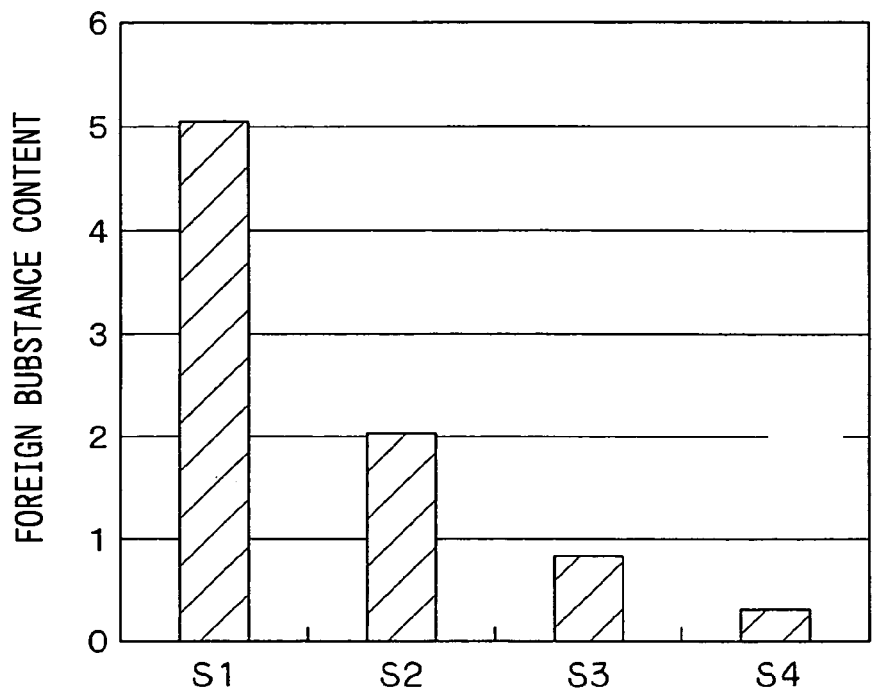
FIG. 5 is a graph showing results of experiments for evaluating a burr removing effect according to the embodiment.

The effectiveness of the chemical polishing in burr removal is confirmed through experiments. Burrs 72 are greatly reduced after the chemical polishing is performed on the surfaces of the plated lid 70 in comparison with other methods. The results of the experiments are shown in FIG. 5. The lid 70 used in the experiments is made of Kovar and plated with nickel. Plating film formed on the surfaces of the lid 70 is about 1 μm to 5 μm. Then, the chemical polishing process shown in FIG. 3 is performed. A chemical abrasive used in this process is CPE1000 of Mitsubishi Gas Chemical Company, Inc. The CPE1000 is a hydrogen peroxide base abrasive normally used for Kovar or 42Alloy. The lid 70 is soaked in a solution composed of the chemical abrasive and water in proportions of 1:1 for 1 to 10 minutes at room temperatures.

Electrolytic polishing and barrel polishing are also available for removing burrs after plating. In the electrolytic polishing, a positive electrode and a negative electrode are placed in a plating tank with polarities opposite to the case of plating. Moreover, sintering and lasering can be used for baking burrs on the nickel-plated surfaces to reduce burrs from falling from the plated surfaces. The lid 70 without treatment (sample S1), the lid 70 treated by the sintering (sample S2), and the lid 70 treated by the electrolytic polishing (sample S3) after plating are also evaluated in the experiments in addition to the lid 70 treated with the chemical polishing (sample S4).

In the evaluation of the effectiveness of each treatment in burr removal, surface roughness of the lid 70 is measured and the roughness of each lid 70 is equal to or smaller than 0.1 μm. However, small burrs that form on or adhere to the nickel-plated surface ranging from several to tens of micrometers are recognized in inspection of the surface by a scanning electron microscope (SEM).

When the lid 70 is cleaned in ethanol by ultrasonic cleansing, burrs are removed from the plating films 71 and mixed in the ethanol. The number of burrs can be counted by measuring the amount of foreign substances in the ethanol. Therefore, the burr removing effectiveness can be evaluated based on the amount of foreign substance in the ethanol. Namely, the smaller the amount of foreign substances in the ethanol, the higher the burr removing effectiveness is. The burr removing effectiveness of each treatment is evaluation by counting foreign substances equal to or larger than 2 μm.

The evaluation results are indicated in relative values regarding the amount of foreign substances in the ethanol, or foreign substance content in the ethanol, after cleaning each sample S1, S2, S3, S4. The results show that the amount of foreign substance regarding sample S4 is one tenth smaller than the amount of foreign substance regarding sample S1. The SEM inspections are performed on surfaces of the lids 70 without treatment and treated by the electrolytic polishing, the sintering, the barrel polishing, and the chemical polishing, respectively. The inspection results show that surface roughness becomes smaller from the lid 70 without treatment and the lid 70 treated by the chemical polishing in the above order.

From the results, it is clear that burrs on the plating films are greatly reduced by the chemical polishing performed after plating with respect to the other burr removing methods. Because the method for manufacturing the acceleration sensor device 100 includes the chemical polishing step after plating, the burrs 72 on the plating films 71 on surfaces of the lid 70 are greatly reduced.

After burrs 72 on its plated surfaces are greatly reduced, the lid 70 is fixed to the package body 10 in which the semiconductor sensor chip 50 is arranged. Then, the manufacturing process of the acceleration sensor device 100 is completed. With this method, a problem that burrs 72 on the lid 70 falling onto the semiconductor sensor chip 50 during a transfer of the acceleration sensor device 100 is less likely to occur.

The present invention should not be limited to the embodiment previously discussed and shown in the figures, but may be implemented in various ways without departing from the spirit of the invention. For example, this method can be applied to a device having an acceleration sensor chip, an angle speed sensor chip, and a surface acoustic element housed in a package body and a plated lid fixed to the package body. This method can be applied to any device having a plated lid fixed after an electronic component is arranged in a package body for covering an opening of the package body.

What is claimed is:

1. A method for manufacturing an electronic device including a package, comprising:
    plating a lid of the package such that a plating film is formed on a surface of the lid;
    removing burrs on the plating film on the lid surface by chemical polishing;
    inserting the electronic component in a package body through an opening thereof located on one of sides thereof; and
    attaching the lid to the package body.

2. The method according to claim 1, wherein the lid is plated with nickel.

3. The method according to claim 1, wherein the lid is attached to the package body by welding.

4. The method according to claim 1, wherein the step of removing burrs includes:
    preparing a solution composed of chemical abrasive and water in proportions of 1:1; and
    soaking the lid in the solution for one to ten minutes at a room temperature.

5. The method according to claim 4, wherein the chemical abrasive is a hydrogen peroxide base abrasive.

6. The method according to claim 1, wherein the removing of the burrs includes physically separating the burrs from the plating film by the chemical polishing.

7. The method according to claim 1, wherein the removing of the burrs includes removing the burrs from the plating film by the chemical polishing without entirely dissolving the burrs.

8. The method according to claim 1, further comprising treating the surface of the lid by chemical polishing using a chemical solution before the plating of the lid of the package, wherein the removing of the burrs on the plating film includes treating the burrs on the plating film using a chemical solution, which is the same type as the chemical solution used in the treating of the surface of the lid.

* * * * *